(12) United States Patent
Lee et al.

(10) Patent No.: US 11,815,297 B2
(45) Date of Patent: Nov. 14, 2023

(54) HEAT CONVERSION DEVICE

(71) Applicant: LG INNOTEK CO., LTD., Seoul (KR)

(72) Inventors: Un Hak Lee, Seoul (KR); Jong Hyun Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 199 days.

(21) Appl. No.: 17/604,820

(22) PCT Filed: Apr. 3, 2020

(86) PCT No.: PCT/KR2020/004570
§ 371 (c)(1),
(2) Date: Oct. 19, 2021

(87) PCT Pub. No.: WO2020/218753
PCT Pub. Date: Oct. 29, 2020

(65) Prior Publication Data
US 2022/0260288 A1 Aug. 18, 2022

(30) Foreign Application Priority Data
Apr. 25, 2019 (KR) .................. 10-2019-0048600

(51) Int. Cl.
F25B 21/02 (2006.01)
F28D 1/02 (2006.01)
H05K 7/20 (2006.01)

(52) U.S. Cl.
CPC ............ F25B 21/02 (2013.01); F28D 1/0233 (2013.01); H05K 7/20409 (2013.01); F25B 2321/023 (2013.01); F25B 2321/0251 (2013.01)

(58) Field of Classification Search
CPC ........... H05K 7/20409; F25B 2321/023; F25B 2321/0251; F25B 21/02; F28D 1/0233
See application file for complete search history.

(56) References Cited

U.S. PATENT DOCUMENTS

| 1,813,123 A * | 7/1931 | Murray | ................ F28F 3/025 |
| | | | 165/182 |
| 10,166,834 B2 * | 1/2019 | Oh | ................ B60H 1/00271 |

(Continued)

FOREIGN PATENT DOCUMENTS

| JP | 08-189725 | 7/1996 |
| KR | 10-1055668 | 8/2011 |

(Continued)

OTHER PUBLICATIONS

International Search Report dated Jul. 7, 2020 issued in Application No. PCT/KR2020/004570.

*Primary Examiner* — Gordon A Jones
(74) *Attorney, Agent, or Firm* — KED & ASSOCIATES, LLP

(57) ABSTRACT

Disclosed is a power generation device including a case including a through hole configured to pass therethrough in a first direction and form an inner surface, a duct disposed in the through hole of the case and having a flow path such that a first fluid flows in a second direction perpendicular to the first direction, a first thermoelectric module including a first thermoelectric device disposed on a first surface of the duct and a first fin disposed in the first thermoelectric device, a second thermoelectric module including a second thermoelectric device disposed on a second surface facing the first surface of the duct and a second fin disposed in the second thermoelectric device, a plurality of first guide portions coupled to the case and disposed on the duct while facing each other, and a second guide portion disposed on a third surface formed between the first surface and the second surface of the duct. Here, the second guide portion extends between the plurality of first guide portions in the second direction. Also, the plurality of first guide portions and the second guide portion each include a tilting surface, and a tilt (Continued)

angle of the tilting surface of the second guide portion differs from a tilt angle of the tilting surface of each of the plurality of first guide portions.

20 Claims, 14 Drawing Sheets

(56) References Cited

U.S. PATENT DOCUMENTS

| | | | | |
|---|---|---|---|---|
| 11,631,992 | B2* | 4/2023 | Ma | H05B 3/46 60/659 |
| 2005/0210883 | A1 | 9/2005 | Bell | |
| 2011/0303405 | A1* | 12/2011 | Scott | F28F 3/022 165/185 |
| 2013/0192803 | A1* | 8/2013 | Garret | F28D 1/05333 165/151 |
| 2016/0137036 | A1* | 5/2016 | Oh | B60H 3/024 62/3.4 |
| 2016/0333843 | A1* | 11/2016 | Rubitschek | F02N 19/04 |
| 2017/0038162 | A1* | 2/2017 | Taylor | F28D 1/0233 |
| 2017/0341483 | A1* | 11/2017 | Hirasawa | H01M 10/6552 |
| 2018/0201374 | A1* | 7/2018 | Trümper | F25D 31/005 |
| 2020/0154894 | A1* | 5/2020 | Oh | A47C 16/02 |
| 2020/0254385 | A1* | 8/2020 | Siann | F24F 3/14 |
| 2020/0373638 | A1* | 11/2020 | Lee | H01M 10/6572 |
| 2021/0156310 | A1* | 5/2021 | Prociw | F02C 7/224 |

FOREIGN PATENT DOCUMENTS

| | | |
|---|---|---|
| KR | 10-2014-0098435 | 8/2014 |
| KR | 10-2015-0132209 | 11/2015 |
| KR | 10-2017-0063817 | 6/2017 |
| KR | 10-2018-0134070 | 12/2018 |
| KR | 10-2083611 | 3/2020 |

* cited by examiner

HEAT CONVERSION DEVICE

CROSS-REFERENCE TO RELATED PATENT APPLICATIONS

This application is a U.S. National Stage Application under 35 U.S.C. § 371 of PCT Application No. PCT/KR2020/004570, filed Apr. 3, 2020, which claims priority to Korean Patent Application No. 10-2019-0048600, filed Apr. 25, 2019, whose entire disclosures are hereby incorporated by reference.

TECHNICAL FIELD

The present invention relates to a heat conversion device, and more particularly, to a heat conversion device which generates power using heat from a warm gas.

BACKGROUND ART

A thermoelectric phenomenon is a phenomenon caused by transport of electrons and holes in a material and means direct energy conversion between heat and electricity.

A thermoelectric device is a generic term for devices using the thermoelectric phenomenon and has a structure in which a p-n junction pair is formed by joining a p-type thermoelectric material and an n-type thermoelectric material between metal electrodes.

Thermoelectric devices may be divided into a device using a temperature change in electrical resistance, a device using the Seebeck effect that is a phenomenon in which an electromotive force is generated by a temperature difference, a device using the Peltier effect that is a phenomenon in which endothermic reaction or exothermic reaction occurs due to a current, and the like.

Thermoelectric devices have been diversely applied to home appliances, electronic components, communication components, and the like. For example, thermoelectric devices may be applied to a cooling apparatus, a heat emission apparatus, a power generation apparatus, and the like. Accordingly, the demand for thermoelectric performance of a thermoelectric device has gradually increased.

Recently, it has been necessary to generate electricity using waste heat at a high temperature that is generated from an engine of a vehicle, vessel, or the like and a thermoelectric device. Here, a structure for increasing power generation performance is necessary.

RELATED ART DOCUMENTS

Patent Documents

Patent Document 1: Korean Patent Publication No. 10-2015-0132209 (Nov. 25, 2015)
Patent Document 2: Korean Patent Publication No. 10-2017-0063817 (Jun. 8, 2017)
Patent Document 3: Korean Patent Publication No. 10-2018-0134070 (Dec. 18, 2018)

DISCLOSURE

Technical Problem

The present invention is directed to providing a heat conversion device which generates power using waste heat.

Technical Solution

One aspect of the present invention provides a power generation device including a case including a through hole configured to pass therethrough in a first direction and form an inner surface, a duct disposed in the through hole of the case and having a flow path such that a first fluid flows in a second direction perpendicular to the first direction, a first thermoelectric module including a first thermoelectric device disposed on a first surface of the duct and a first fin disposed in the first thermoelectric device, a second thermoelectric module including a second thermoelectric device disposed on a second surface facing the first surface of the duct and a second fin disposed in the second thermoelectric device, a plurality of first guide portions coupled to the case and disposed on the duct while facing each other, and a second guide portion disposed on a third surface formed between the first surface and the second surface of the duct. Here, the second guide portion extends between the plurality of first guide portions in the second direction. Also, the plurality of first guide portions and the second guide portion each include a tilting surface, and a tilt angle of the tilting surface of the second guide portion differs from a tilt angle of the tilting surface of each of the plurality of first guide portions.

The tilting surface of the second guide portion may be disposed in the second direction.

The tilting surface of the first guide portion may tilt from the first direction or the second direction such that a second fluid flows in the first direction, and the tilting surface of the second guide portion may tilt from the first direction such that the second fluid diverges and flows in the first direction.

A temperature of the second fluid may be higher than a temperature of the first fluid.

The duct may include a plurality of support portions coupled to the inner surface of the through hole of the case and disposed to face each other and a body portion disposed between the plurality of support portions. Also, the plurality of first guide portions may be disposed on the plurality of support portions of the duct, and the second guide portion may be disposed on the body portion of the duct.

The first guide portions and the second guide portion may not be overlapped with each other in the first direction.

A length of each of the plurality of support portions of the duct in the first direction may be greater than a length of the body portion of the duct in the first direction. Also, a length of each of the plurality of support portions of the duct in the second direction may be smaller than a length of the body portion of the duct in the first direction.

Each of the plurality of first guide portions may include a coupling portion coupled to the inner surface of the through hole and become more adjacent to the duct in a direction away from the coupling portion in the second direction.

The second guide portion and the tilting surfaces of the plurality of first guide portions may not be overlapped with each other in the second direction.

The plurality of first guide portions may each include a first end most adjacent to the duct, and the second guide portion may include an end in the second direction.

The support portions of the duct may each include a side facing the second guide portion. Also, a plurality of first ends of the plurality of first guide portions may be disposed on the support portions of the duct, and the plurality of first ends may be adjacent to the side.

The first fin and the second fin may each extend in the first direction.

The first fin and the second fin may each be spaced at a certain interval apart from the second guide portion in the first direction.

The duct may include a plurality of such spaced-apart ducts. Here, each of the plurality of ducts may include a first surface and a second surface, which face each other. Also, the first thermoelectric module may include a plurality of one-side thermoelectric modules disposed on the first surface and the second thermoelectric module may include a plurality of other-side thermoelectric modules disposed on the second surface.

The plurality of one-side thermoelectric modules may include a plurality of first portions facing the inner surface of the through hole and a plurality of second portions facing the second thermoelectric module. Also, the plurality of other-side thermoelectric modules may include a plurality of third portions facing the inner surface of the through hole and a plurality of fourth portions facing the first thermoelectric module.

The second portions of the one-side thermoelectric modules may be spaced at certain intervals apart from the fourth portions of the other-side thermoelectric modules.

Each of the first thermoelectric module and the second thermoelectric module may include a plurality of first fastening portions coupled to the duct.

The plurality of first fastening portions may be disposed to be spaced apart from each other in the second direction.

The second guide portion may include a plurality of grooves, and the plurality of grooves may be disposed to be spaced apart from each other in the second direction.

A plurality of second fastening portions may be disposed in the plurality of grooves of the second guide portion. Here, the plurality of first fastening portions may face the first surface and the second surface of the duct. Also, the plurality of second fastening portions may face the third surface of the duct, and the first surface and the second surface may be perpendicular to the third surface.

Another aspect of the present invention provides a power generation device including a duct through which a cooling fluid passes in a first direction, a first thermoelectric module including a first thermoelectric device disposed on a first surface of the duct and a first heat dissipation fin disposed on the first thermoelectric device, a second thermoelectric module including a second thermoelectric device disposed on a second surface disposed to be parallel to the first surface of the duct and a second heat dissipation fin disposed on the second thermoelectric device, and a gas guide member disposed on a third surface disposed between the first surface and the second surface of the duct. Here, the gas guide member includes a region in which a distance from the third surface increases from the first surface and the second surface toward a center of the third surface. A width between an outside of the first heat dissipation fin and an outside of the second heat dissipation fin is greater than a width of the gas guide member. The region of the gas guide member disposed to correspond to the center of the third surface diverges toward the first thermoelectric module and the second thermoelectric module and further includes an insulation member disposed on the third surface between the third surface and the gas guide member and a shielding member disposed on the insulation member between the third surface and the gas guide member.

A distance between the first surface and the first heat dissipation fin may be greater than a distance between the first surface and the first thermoelectric device, and a distance between the second surface and the second heat dissipation fin may be greater than a distance between the second surface and the second thermoelectric device.

A width between an outside of the first thermoelectric device and an outside of the second thermoelectric device may be greater than a width of the gas guide member.

The gas guide member may be further disposed on a fourth surface disposed to be parallel to the third surface and between the first surface and the second surface.

The insulation member may include a first insulation surface disposed on the third surface, a second insulation surface extending from the first insulation surface in a direction parallel to the first surface and disposed on a part of the first surface or a part of the first thermoelectric device, and a third insulation surface extending from the first insulation surface in a direction parallel to the second surface and disposed on a part of the second surface or a part of the second thermoelectric device. The shielding member may include a first shielding surface disposed on the first insulation surface, a second shielding surface extending from the first shielding surface in a direction parallel to the first surface and disposed on at least a part of the second insulation surface, and a third shielding surface extending from the first shielding surface in a direction parallel to the second surface and disposed on at least a part of the third insulation surface.

The gas guide member, the first shielding surface, the first insulation surface, and the third surface may be fastened together.

An air layer may be formed between the gas guide member and the first shielding surface.

Still another aspect of the present invention provides a power generation system including a first power generation device, a second power generation device disposed to be parallel to the first power generation device and spaced at a certain interval apart from the first power generation device, and a frame configured to support the first power generation device and the second power generation device. Each of the first power generation device and the second power generation device includes a duct through which a cooling fluid passes in a first direction, a first thermoelectric module including a first thermoelectric device disposed on a first surface of the duct and a first heat dissipation fin disposed on the first thermoelectric device, a second thermoelectric module including a second thermoelectric device disposed on a second surface disposed to be parallel to the first surface of the duct and a second heat dissipation fin disposed on the second thermoelectric device, a first gas guide member disposed on a third surface disposed between the first surface and the second surface of the duct and to be spaced apart from the third surface, and a second gas guide member disposed on a fourth surface disposed to be parallel to the third surface and between the first surface and the second surface and spaced apart from the fourth surface. The first gas guide member includes a region in which a distance from the third surface increases from the first surface and the second surface toward a center of the third surface. A width between an outside of the first heat dissipation fin and the second heat dissipation fin is greater than a width of the first gas guide member. The region of the first gas guide member disposed to correspond to the center of the third surface allows a gas inflow to diverge toward the first thermoelectric module and the second thermoelectric module. The frame includes openings formed on both sides in a second direction perpendicular to the first direction and parallel to the first surface and the second surface to allow the gas to pass therethrough and includes an opening formed on both sides in the first direction to allow the cooling fluid to pass therethrough. The gas passes through the second thermoelectric module of the first power generation device and the first thermoelectric module of the second power generation device.

The frame may further include a first tilting member disposed to tilt from one wall surface of the frame toward one sides of the first gas guide members of the first power generation device and the second power generation device and a second tilting member disposed to tilt from another wall surface of the frame toward other sides of the first gas guide members of the first power generation device and the second power generation device. The one wall surface of the frame, the first tilting member, the first gas guide members, the second tilting member, and the other wall surface of the frame may be sequentially arranged in the first direction.

Each of the first power generation device and the second power generation device may further include a fluid inlet portion disposed on one end of the duct and through which the cooling fluid flows in and a fluid outlet portion, which is disposed on the other end of the duct and through which the cooling fluid is discharged. The first tilting member may extend from the one wall surface of the frame toward a boundary between the duct and the fluid inlet portion, and the second tilting member may extend from the other wall surface of the frame toward a boundary between the duct and the fluid outlet portion.

Advantageous Effects

According to embodiments of the present invention, a heat conversion device having excellent power generation performance can be provided. Particularly, according to embodiments of the present invention, the number and occupied volume of used components may be reduced so as to obtain a heat conversion device which is simply assembled and has excellent power generation performance. Also, according to embodiments of the present invention, a heat conversion device having improved efficiency in transferring heat to a thermoelectric device can be obtained. Also, according to embodiments of the present invention, power generation capacity may be adjusted by adjusting the number of heat conversion devices. Also, according to embodiments of the present invention, a contact area between a gas at a high temperature and a heat dissipation fin of a thermoelectric module may be maximized such that power generation efficiency may be maximized.

MODES OF THE INVENTION

Hereinafter, exemplary embodiments of the present invention will be described in detail with reference to the drawings.

However, the present invention is not limited to the embodiments disclosed below, but can be implemented in various forms. One or more components of the embodiments may be selectively combined or substituted with one another without departing from the scope of the technical concept of the present invention.

Also, unless defined otherwise, the terms (including technical and scientific terms) used herein may be used as meanings commonly understandable by one of ordinary skill in the art. Also, terms defined in generally used dictionaries may be construed in consideration of the contextual meanings of the related art.

Also, the terms used herein are intended to describe the embodiments but not intended to restrict the present invention.

In the specification, unless stated otherwise particularly, singular forms include plural forms. When it is stated that at least one (or one or more) of A, B, and C, it may include one or more of all combinations of A, B, and C.

Also, in describing components of the embodiments of the present invention, the terms such as first, second, A, B, (a), (b), and the like may be used.

These terms are merely for distinguishing one element from another, and the essential, order, sequence, and the like of corresponding elements are not limited by the terms.

Also, when it is stated that one element is "connected," or "coupled" to another, the element may not only be directly connected or coupled to the other element but may also be connected or coupled to the other element with another intervening element.

Also, when it is stated that an element is formed or disposed "above or below" another element, the two elements may not only come into direct contact with each other but also still another element may be formed or disposed between the two elements. Also, being "above (on) or below (beneath)" may include not only being in an upward direction but also being in a downward direction on the basis of one element.

Figure 1:
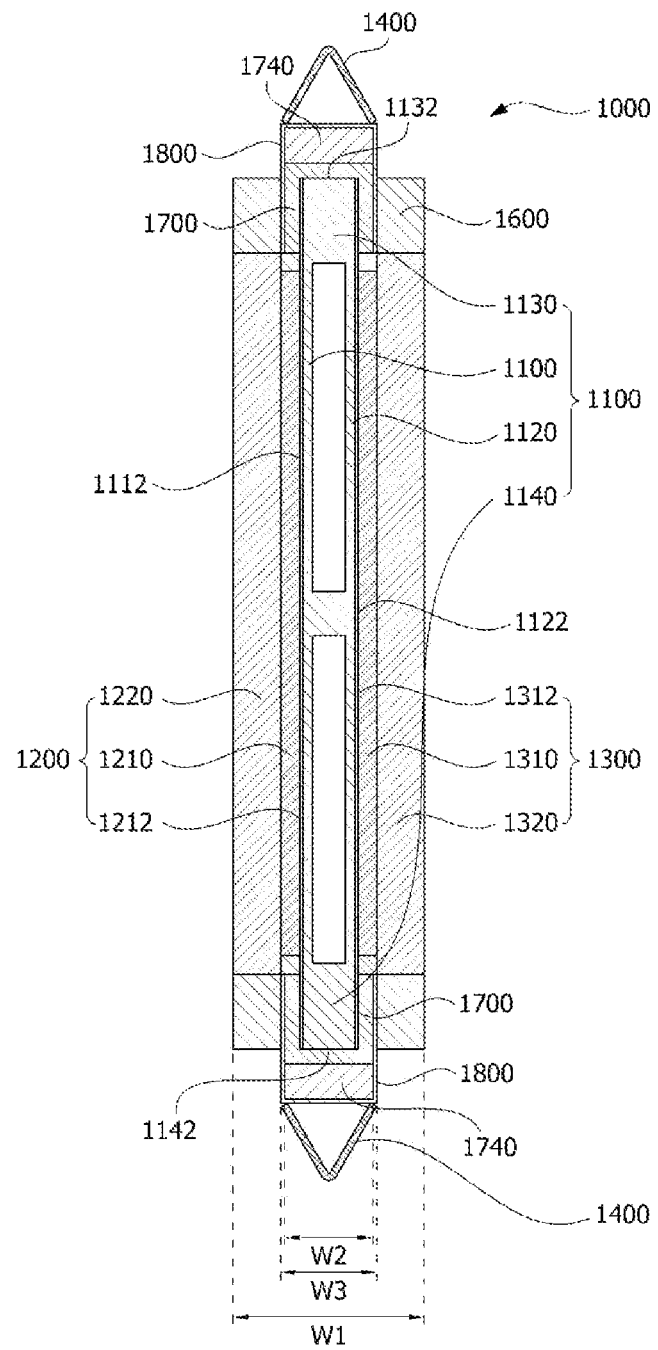
FIG. 1 is a cross-sectional view of a heat conversion device according to one embodiment of the present invention.
Figure 2:
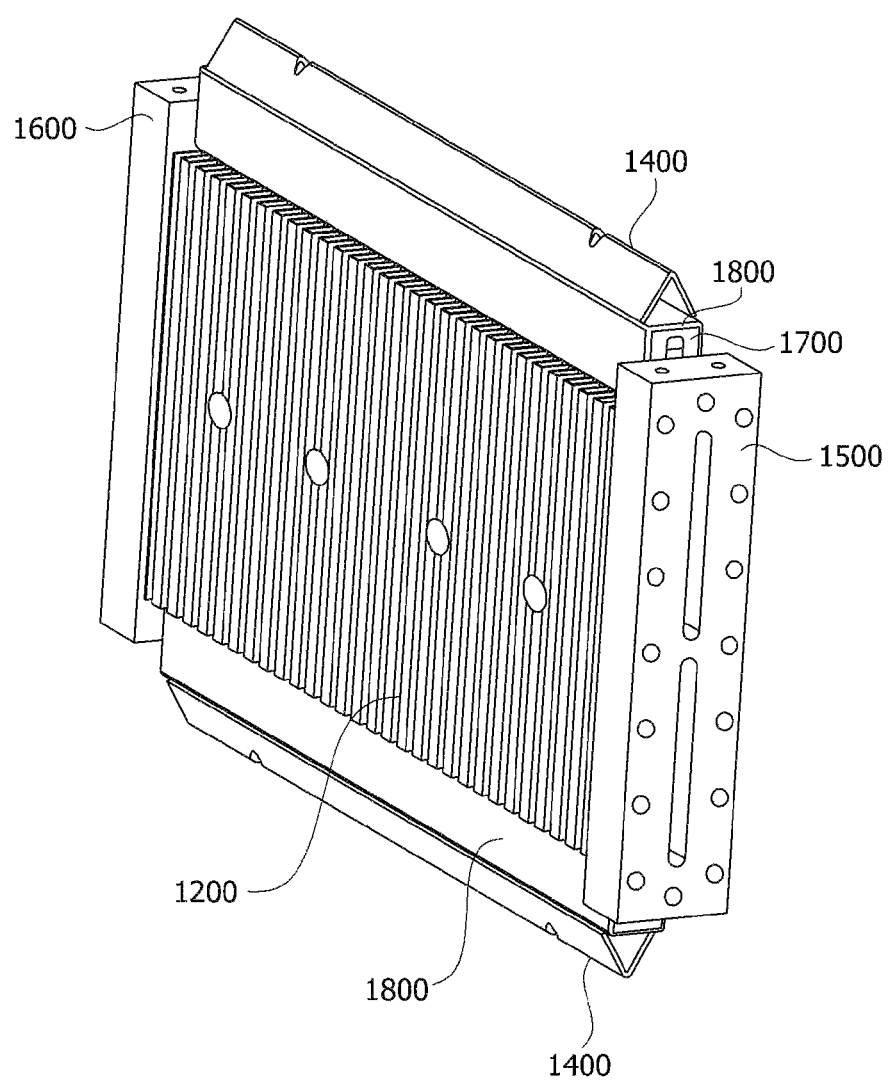
FIG. 2 is a perspective view of the heat conversion device according to one embodiment of the present invention.
Figure 3:
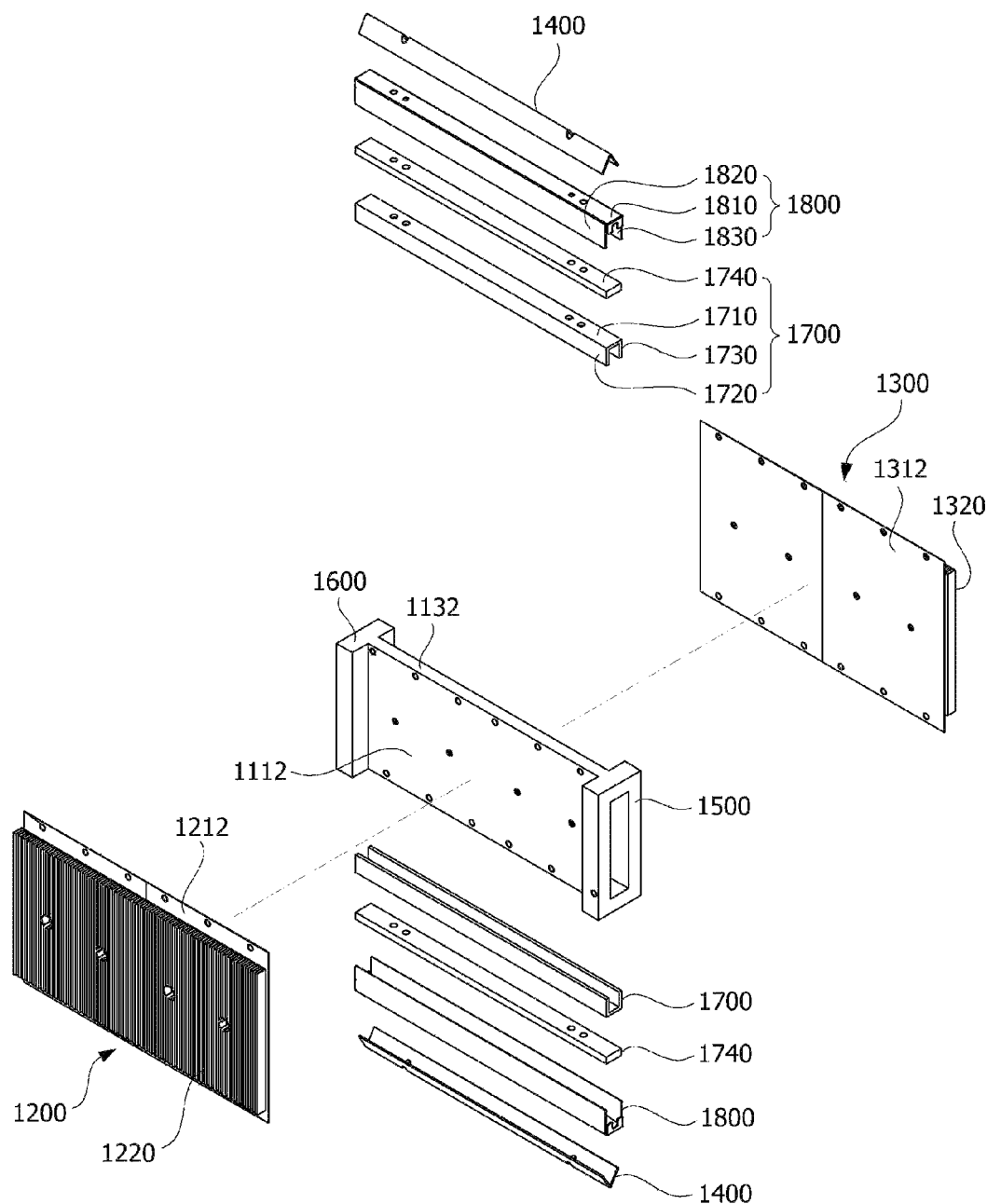
FIG. 3 is an exploded perspective view of the heat conversion device according to one embodiment of the present invention.
Figure 4:
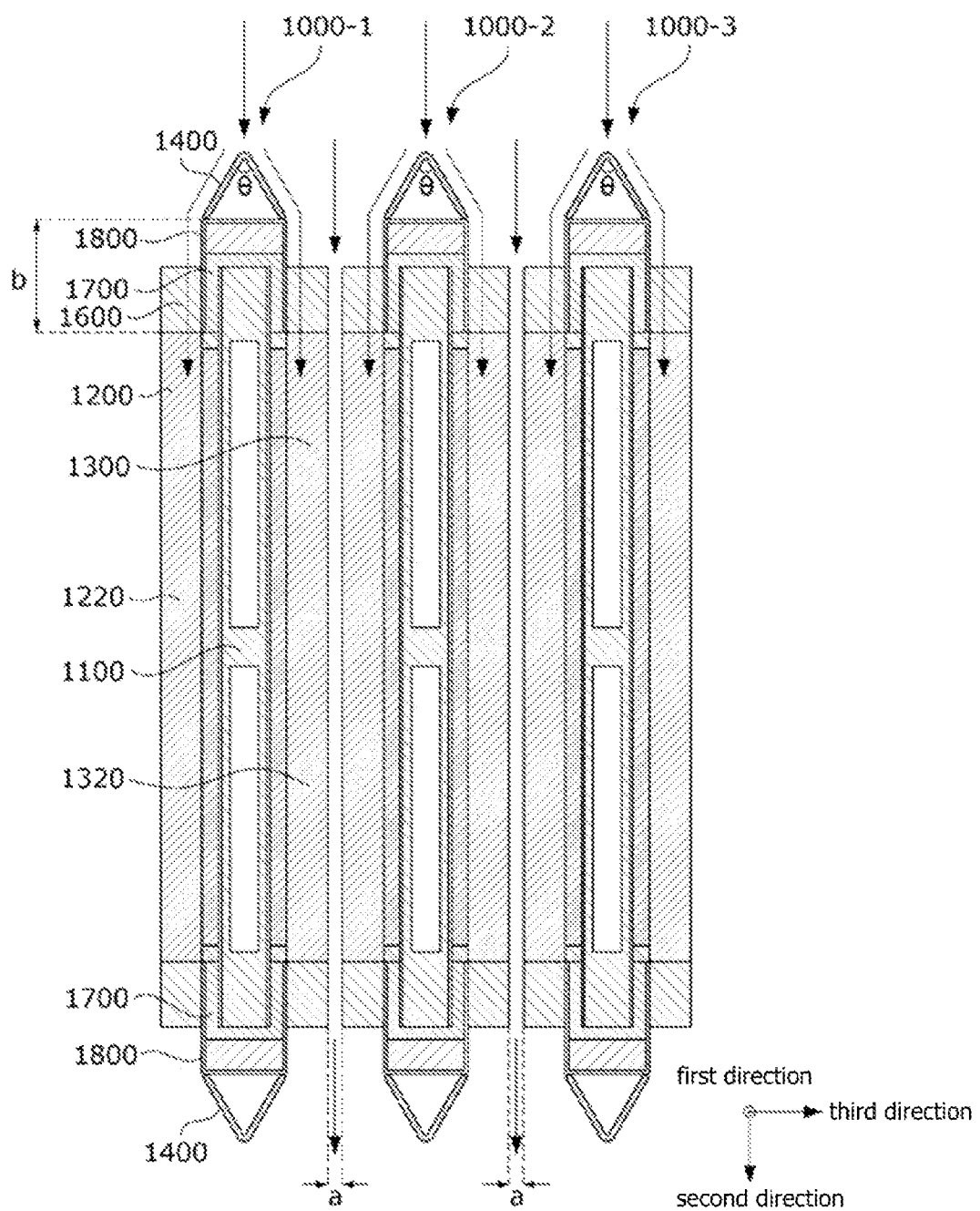
FIG. 4 is a partial cross-sectional view of a heat conversion system including heat conversion devices according to one embodiment of the present invention.
Figure 5:
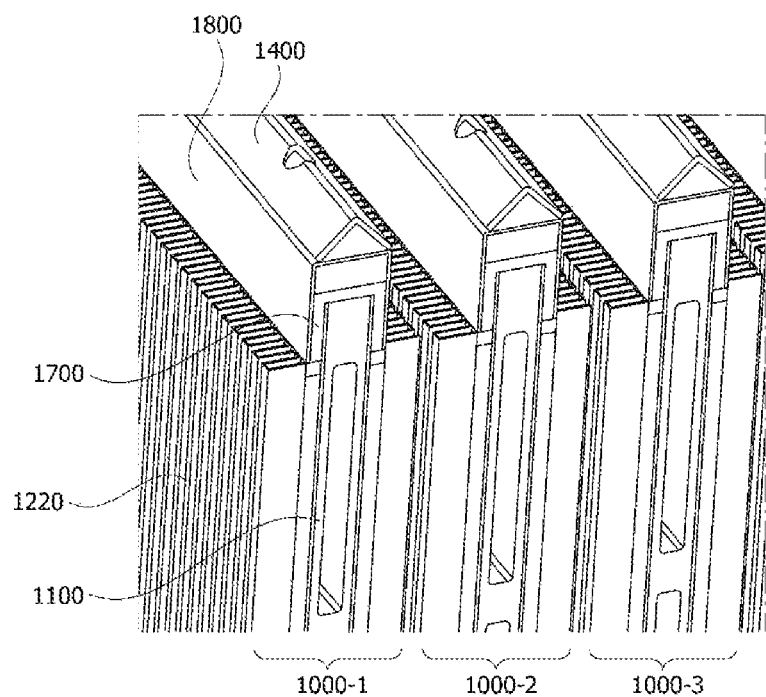
FIG. 5 is a partial cross-sectional view of the heat conversion system including heat conversion devices according to one embodiment of the present invention.

FIG. 1 is a cross-sectional view of a heat conversion device according to one embodiment of the present invention. FIG. 2 is a perspective view of the heat conversion device according to one embodiment of the present invention. FIG. 3 is an exploded perspective view of the heat conversion device according to one embodiment of the present invention. FIG. 4 is a partial cross-sectional view of a heat conversion system including heat conversion devices according to one embodiment of the present invention. FIG. 5 is a partial cross-sectional view of the heat conversion system including heat conversion devices according to one embodiment of the present invention.

FIG. 6 is cross-sectional views illustrating a thermoelectric device included in a thermoelectric module according to one embodiment of the present invention. FIG. 7 is a perspective view illustrating thermoelectric devices included in the thermoelectric module according to one embodiment of the present invention.

Referring to FIGS. 1 to 5, a heat conversion device 1000 includes a duct 1100, a first thermoelectric module 1200, a second thermoelectric module 1300, and a gas guide member 1400. Also, a heat conversion system may include a plurality of such heat conversion devices 1000 of FIGS. 1 to 3. Here, a plurality of heat conversion devices 1000-1, 1000-2, and 1000-3 may be arranged to be spaced apart at certain intervals.

The heat conversion device 1000 according to the embodiment of the present invention may generate power using a temperature difference between a cooling fluid flowing through an inside the duct 1100 and a high-temperature gas passing along an outside of the duct 1100. Accordingly, in the specification, the heat conversion device may be referred to as a power generation device. In the specification, the fluid flowing through the inside of the duct 1100 may be referred to as a first fluid, and the gas passing along the outside of the duct 1100 may be referred to as a second fluid. Accordingly, a temperature of the second fluid may be higher than a temperature of the first fluid.

To this end, the first thermoelectric module 1200 may be disposed on one surface of the duct 1100, and the second thermoelectric module 1300 may be disposed on another surface of the duct 1100. Here, one of both surfaces of each of the first thermoelectric module 1200 and the second thermoelectric module 1300, which is disposed to face the duct 1100, becomes a low-temperature portion, and power may be generated using a temperature difference between the low-temperature portion and a high-temperature portion.

The cooling fluid flowing into the duct 1100 may be water but is not limited thereto and may be a variety of types of fluids having cooling performance. A temperature of the cooling fluid flowing into the duct 1100 may be less than 100° C. and preferably, less than 50° C. and more particularly, less than 40° C. but is not limited thereto. A temperature of the cooling fluid passing through and discharged from the duct 1100 may be higher than the temperature of the cooling fluid flowing into the duct 1100. The duct 1100 includes a first side 1110, a second side 1120 facing the first side 1110 and disposed to be parallel to the first side 1110, a third side 1130 disposed between the first side 1110 and the second side 1120, and a fourth side 1140 disposed between the first side 1110 and the second side 1120 to face the third side 1130. The cooling fluid flows into the inside of the duct formed by the first side 1110, the second side 1120, the third side 1130, and the fourth side 1140. The cooling fluid flows into a cooling fluid inlet of the duct 1100 and is discharged through a cooling fluid outlet. In order to allow the cooling fluid to easily flow into and be discharged and to support the duct 1100, an inlet flange 1500 and an outlet flange 1600 may be further disposed on the cooling fluid inlet and the cooling fluid outlet of the duct 1100, respectively. The inlet flange 1500 and the outlet flange 1600 have a plate shape with an opening formed therein to correspond to the cooling fluid inlet and the cooling fluid outlet, respectively. The opening formed in the inlet flange 1500 may be formed to have a size, a shape, and a position in coincidence with those of the cooling fluid inlet of the duct 1100. The opening (not shown) formed in the outlet flange 1600 may be formed to have a size, a shape, and a position in coincidence with to those of the cooling fluid outlet of the duct 1100.

Although not shown, a heat dissipation fin may be disposed on an inner wall of the duct 1100. A shape, number, an area, and the like of the heat dissipation fin occupying the inner wall of the duct 1100 may diversely vary according to a temperature of the cooling fluid, a temperature of waste heat, a necessary power generation capacity, and the like. The area of the heat dissipation fin occupying the inner wall of the duct 1100 may be, for example, 1 to 40% of a cross section of the duct 1100. Accordingly, without interrupting a flow of the cooling fluid, high heat conversion efficiency is obtainable. Here, the heat dissipation fin may have a shape which does not interrupt the flow of the cooling fluid. For example, the heat dissipation fin may be formed along a direction in which the cooling fluid flows. That is, the heat dissipation fin may have a plate shape extending from the cooling fluid inlet toward the cooling fluid outlet, and a plurality of such heat dissipation fins may be arranged to be spaced apart at certain intervals. The heat dissipation fin and the inner wall of the duct 1100 may be integrally formed.

Also, an inside of the duct 1100 may be divided into a plurality of regions. When the inside of the duct 1100 is divided into the plurality of regions, even though a flow rate of the cooling fluid is insufficient to fully fill the inside of the duct 1100, the cooling fluid may be evenly dispersed inside the duct 1100 such that even heat conversion efficiency is obtainable with respect to overall surfaces of the duct 1100.

Meanwhile, the first thermoelectric module 1200 is included in the first side 1110 of the duct 1100 and disposed on a first surface 1112 disposed toward the outside of the duct, and the second thermoelectric module 1300 is included in the second side 1120 of the duct 1100 and disposed on a second surface 1122 disposed toward the outside of the duct to be symmetrical to the first thermoelectric module 1200.

Here, the first thermoelectric module 1200 and the second thermoelectric module 1300 disposed to be symmetrical to the first thermoelectric module 1200 may be referred to as a pair of thermoelectric modules or a unit thermoelectric module.

In the specification, one pair of thermoelectric modules is disposed for each duct 1100 as an example. However, the present invention is not limited thereto and a plurality of pairs of thermoelectric modules, that is, a plurality of such unit thermoelectric modules, may be arranged for each duct 1100. Here, a size and a number of the unit thermoelectric modules may be adjusted according to a necessary power generation amount.

Here, at least some of the plurality of first thermoelectric modules 1200 connected to the duct 1100 may be electrically connected to each other using a busbar (not shown), and at least some of the plurality of second thermoelectric modules 1300 connected to the duct 1100 may be electrically connected to each other using another busbar (not shown). The busbar may be disposed, for example, on an outlet through which high-temperature air is discharged and be connected to an external terminal. Accordingly, since power may be supplied to the plurality of first thermoelectric modules 1200 and the plurality of second thermoelectric modules 1300 without disposing a printed circuit board (PCB) for the plurality of first thermoelectric modules 1200 and the plurality of second thermoelectric modules 1300 in the heat conversion device, it is easy to design and assemble the heat conversion device.

The first thermoelectric module 1200 and the second thermoelectric module 1300 may be fastened to the duct 1100 using a screw. Accordingly, the first thermoelectric module 1200 and the second thermoelectric module 1300 may be stably coupled to a surface of the duct 1100.

Otherwise, at least one of the first thermoelectric module 1200 and the second thermoelectric module 1300 may be bonded to the surface of the duct 1100 using a thermal interface material (TIM).

Meanwhile, each of the first thermoelectric module 1200 and the second thermoelectric module 1300 includes thermoelectric devices 1210 and 1310 disposed on the first surface 1112 and the second surface 1122 and heat dissipation fins 1220 and 1320 disposed on the thermoelectric devices 1210 and 1310. Here, a distance between the first surface 1112 and a first heat dissipation fin 1220 may be greater than a distance between the first surface 1112 and the thermoelectric device 1210, and a distance between the second surface 1122 and the second heat dissipation fin 1320 may be greater than a distance between the second surface 1122 and the thermoelectric device 1310. As described above, the duct 1100 through which the cooling fluid flows may be disposed on one of both sides of the thermoelectric devices 1210 or 1310 and the heat dissipation fins 1220 or 1320 may be disposed on another side thereof. When a high-temperature gas passes through the heat dissipation fins 1220 and 1320, a temperature difference between an endothermic reaction side and an exothermic reaction side of the thermoelectric device 1210 or 1310 may be increased such that heat conversion efficiency may be increased. In the specification, although such components are called the heat dissipation fins 1220 and 1320, this may mean not only fins configured to discharge heat but also fins configured to absorb heat. For example, the heat dissipation fins 1220 and 1320 may increase a temperature of the high-temperature portions, that is, endothermic reaction sides of the thermoelectric devices 1210 and 1310, by absorbing heat from high-temperature gases passing through the plurality of heat conversion devices 1000-1, 1000-2, and 1000-3. Accordingly, the heat dissipation fins 1220 and 1320 may be referred to as heat-reception fins or heat-absorption fins.

Figure 6A:
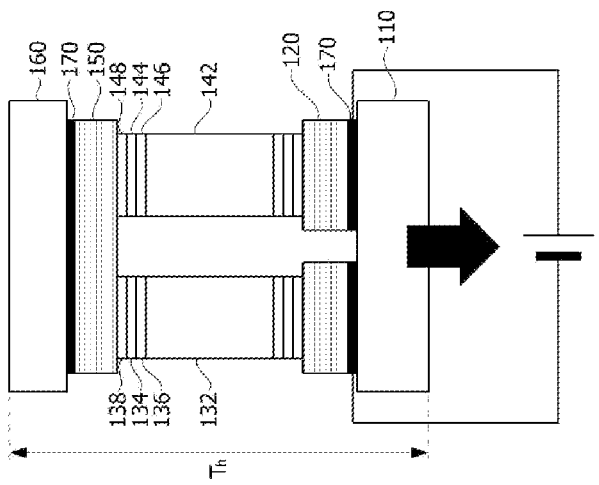
FIGS. 6A and 6B are cross-sectional views illustrating a thermoelectric device included in a thermoelectric module according to one embodiment of the present invention.
Figure 6B:
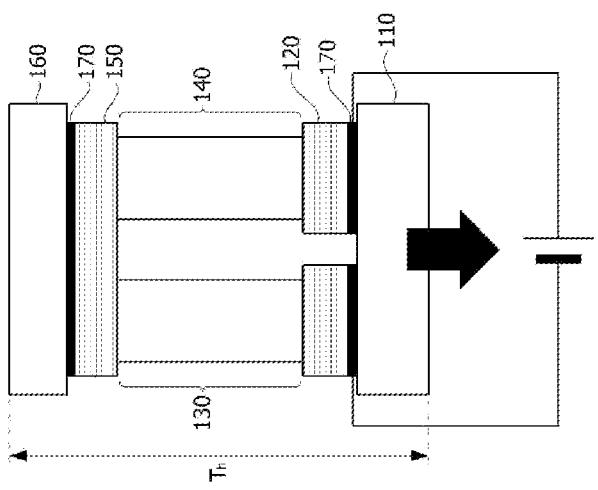
Figure 7:
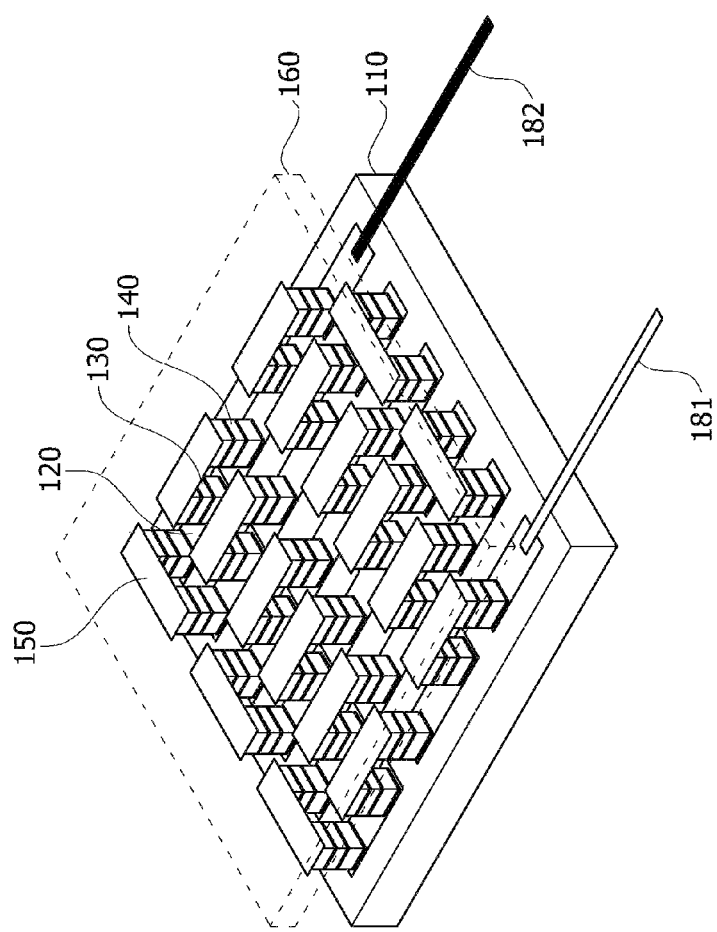
FIG. 7 is a perspective view illustrating thermoelectric devices included in the thermoelectric module according to one embodiment of the present invention.

Here, the thermoelectric devices 1210 and 1310 may have a structure of a thermoelectric device 100 shown in FIGS. 6A to 7. Referring to FIGS. 6A to 7, the thermoelectric device 100 includes a lower substrate 110, a lower electrode 120, a p-type thermoelectric leg 130, an n-type thermoelectric leg 140, an upper electrode 150, and an upper substrate 160.

The lower electrode 120 is disposed between the lower substrate 110 and lower bottom surfaces of the p-type thermoelectric leg 130 and the n-type thermoelectric leg 140, and the upper electrode 150 is disposed between the upper substrate 160 and upper bottom surfaces of the p-type thermoelectric leg 130 and the n-type thermoelectric leg 140. Accordingly, a plurality of such p-type thermoelectric legs 130 and a plurality of such n-type thermoelectric legs 140 are electrically connected by the lower electrode 120 and the upper electrode 150. A pair of the p-type thermoelectric leg 130 and the n-type thermoelectric leg 140, which are disposed between the lower electrode 120 and the upper electrode 150 and electrically connected, may form a unit cell.

For example, when voltages are applied to the lower electrode 120 and the upper electrode 150 through lead wires 181 and 182, a substrate in which currents flow from the p-type thermoelectric leg 130 to the n-type thermoelectric leg 140 may act as an endothermic reaction side and a substrate in which currents flow from the n-type thermoelectric leg 140 to the p-type thermoelectric leg 130 may act as a heat dissipation side.

Here, the p-type thermoelectric leg 130 and the n-type thermoelectric leg 140 may be bismuth telluride (Bi—Te)-based thermoelectric legs including bismuth (Bi) and tellurium (Ti) as a main material. The p-type thermoelectric leg 130 may be a thermoelectric leg including, with respect to an overall weight 100 wt %, 99 to 99.999 wt % of a Bi—Te based main material including at least one of antimony (Sb), nickel (Ni), aluminum (Al), copper (Cu), silver (Ag), lead (Pb), boron (B), gallium (Ga), Te, Bi, and Indium (In) and 0.001 to 1 wt % of a mixture including Bi or Te. For example, the main material may be Bi—Se—Te and Bi or Te may be further included at 0.001 to 1 wt % of the overall weight. The n-type thermoelectric leg 140 may be a thermoelectric leg including, with respect to an overall weight 100 wt %, 99 to 99.999 wt % of a Bi—Te based main material including at least one of selenium (Se), Ni, Al, Cu, Ag, Pb, B, Ga, Te, Bi, and In and 0.001 to 1 wt % of a mixture including Bi or Te. For example, the main material may be Bi—Sb—Te and Bi or Te may be further included at 0.001 to 1 wt % of the overall weight.

The p-type thermoelectric leg 130 and the n-type thermoelectric leg 140 may be formed as a bulk type or stacked type. Generally, the bulk type p-type thermoelectric leg 130 or the bulk type n-type thermoelectric leg 140 may be obtained through a process including manufacturing an ingot by heating a thermoelectric material, obtaining a thermoelectric leg powder by pulverizing and straining the ingot, and sintering the powder, and cutting a sintered body. The stacked type p-type thermoelectric leg 130 and the stacked type n-type thermoelectric leg 140 may be obtained through a process including forming a unit member by applying a paste including a thermoelectric material to a sheet-shaped basic material and stacking and cutting the unit members.

Here, the pair of the p-type thermoelectric leg 130 and the n-type thermoelectric leg 140 may have the same shape and volume or have different shapes and volumes. For example, since electrical conducting properties of the p-type thermoelectric leg 130 and the n-type thermoelectric leg 140 differ from each other, a height or a cross-sectional area of the n-type thermoelectric leg 140 may be formed to differ from a height or a cross-sectional area of the p-type thermoelectric leg 130.

Performance of the thermoelectric device according to one embodiment of the present invention may be shown as a thermoelectric performance index. The thermoelectric performance index ZT may be shown as Equation 1.

$$ZT = \alpha^2 \cdot \sigma \cdot T/k \qquad \text{[Equation 1]}$$

Here, $\alpha$ is a Seebeck coefficient [V/K], $\sigma$ is electrical conductivity [S/m], and $\alpha 2\sigma$ is a power factor [W/mK2]. Also, T is a temperature and k is thermal conductivity [W/mK]. K may be shown as a·cp·ρ, a is thermal diffusivity [cm2/S], cp is specific heat [J/gK], ρ is density [g/cm3].

To obtain the thermoelectric performance coefficient of the thermoelectric device, a Z value (V/K) may be measured using a Z-meter, and the thermoelectric performance index ZT may be calculated using the measured Z value.

According to an embodiment of the present invention, the p-type thermoelectric leg 130 and the n-type thermoelectric leg 140 may have a structure shown in FIG. 6B. Referring to FIG. 6B, the thermoelectric legs 130 and 140 include thermoelectric material layers 132 and 142, first plating layers 134 and 144 stacked on one sides of the thermoelectric material layers 132 and 142, second plating layers 134 and 144 stacked on other sides disposed to face the one sides of the thermoelectric material layers 132 and 142, first bonding layers 136 and 146 and second bonding layers 136 and 146 disposed between the thermoelectric material layers 132 and 142 and the first plating layers 134 and 144 and between the thermoelectric material layers 132 and 142 and the second plating layers 134 and 144, respectively, and first metal layers 138 and 148 and second metal layers 138 and 148 stacked on the first plating layers 134 and 144 and the second plating layers 134 and 144, respectively.

Here, the thermoelectric material layers 132 and 142 may include Bi and Te which are semiconductor materials. The thermoelectric material layers 132 and 142 may have the same material or shape of the p-type thermoelectric leg 130 or the n-type thermoelectric leg 140 which has been described with reference to FIG. 6A.

Also, the first metal layers 138 and 148 and the second metal layers 138 and 149 may be selected from Cu, a Cu alloy, Al, and an Al alloy and have a thickness of 0.1 to 0.5 mm, and preferably, 0.2 to 0.3 mm. Since a thermal expansion coefficient of the first metal layers 138 and 148 and the second metal layers 138 and 148 is similar to or greater than a thermal expansion coefficient of the thermoelectric material layers 132 and 142, compressive stresses are applied to boundaries between the thermoelectric material layers 132 and 142 and the first metal layers 138 and 148 and the second metal layers 138 and 148 such that cracks or delamination may be prevented. Also, since coupling forces between the electrodes 120 and 150 and the first metal layers 138 and 148 and the second metal layers 138 and 148 are high, the thermoelectric legs 130 and 140 may be stably coupled with the electrodes 120 and 150.

Next, each of the first plating layers 134 and 144 and the second plating layer 134 and 144 may include at least one of Ni, tin (Sn), Ti, iron (Fe), Sb, chrome (Cr), and molybdenum (Mo) and have a thickness of 1 to 20 μm, and preferably, 1 to 10 μm. Since the first plating layers 134 and 144 and the second plating layers 134 and 144 prevent reactions between Bi or Te, which is a semiconductor material in the thermoelectric material layers 132 and 142, and the first metal layers 138 and 148 and the second metal layers 138 and 148, it is possible to prevent not only a decrease in performance of the thermoelectric device but also oxidization of the first metal layers 138 and 148 and the second metal layers 138 and 148.

Here, the first bonding layers 136 and 146 and the second bonding layers 136 and 146 may be disposed between the thermoelectric material layers 132 and 142 and the first plating layers 134 and 144 and the thermoelectric material layers 132 and 142 and the second plating layers 134 and 144. Here, the first bonding layers 136 and 146 and the second bonding layers 136 and 146 may include Te. For example, the first bonding layers 136 and 146 and the second bonding layers 136 and 146 may include at least one of Ni—Te, Sn—Te, Ti—Te, Fe—Te, Sb—Te, Cr—Te, and Mo—Te. According to an embodiment of the present invention, each of the first bonding layers 136 and 146 and the second bonding layers 136 and 146 may have a thickness of 0.5 to 100 μm, and preferably, 1 to 50 μm. According to an embodiment of the present invention, it is possible to prevent Te in the thermoelectric material layers 132 and 142 from being diffused toward the first plating layers 134 and 144 and the second plating layers 134 and 144 by previously disposing the first bonding layers 136 and 146 and the second bonding layers 136 and 146, which include Te, between the thermoelectric material layers 132 and 142 and the first plating layers 134 and 144 and the second plating layers 134 and 144. Accordingly, occurrence of a Bi-rich region may be prevented.

Meanwhile, the lower electrode 120 disposed between the lower substrate 110 and the p-type thermoelectric leg 130 and the n-type thermoelectric leg 140 and the upper electrode 150 disposed between the upper substrate 160 and the p-type thermoelectric leg 130 and the n-type thermoelectric leg 140 may include at least one of Cu, Ag, and Ni and have thicknesses of 0.01 mm to 0.3 mm. When the thickness of the lower electrode 120 or the upper electrode 150 is less than 0.01 mm, a function thereof as an electrode is degraded such that electrical conducting performance may be decreased. When the thickness exceeds 0.3 mm, conducting efficiency may be decreased due to an increase in resistance.

Also, the lower substrate 110 and the upper substrate 160 which face each other may be insulating substrates or metal substrates. The insulating substrate may be an alumina substrate or a polymer resin substrate having flexibility. The polymer resin substrate having flexibility may include a variety of insulating resin materials such as polyimide (PI), polystyrene (PS), poly(methylmethacrylate) (PMMA), a circular olefin copolymer (COC), polyethylene terephthalate (PET), high-transmission plastic such as resin, and the like. The metal substrate may include Cu, Al, or a Cu—Al alloy and have a thickness of 0.1 mm to 0.5 mm. When the thickness of the metal substrate is less than 0.1 mm or more than 0.5 mm, heat dissipation properties or heat conductivity may be excessively increased such that reliability of the thermoelectric device may be degraded. Also, when the lower substrate 110 and the upper substrate 160 are the metal substrates, dielectric layers 170 may be further formed between the lower substrate 110 and the lower electrode 120 and between the upper substrate 160 and the upper electrode 150. The dielectric layer 170 may include a material having heat conductivity of 5 to 10 W/mK and be formed to have a thickness of 0.01 mm to 0.15 mm. When the thickness of the dielectric layer 170 is less than 0.01 mm, insulation efficiency or a withstand voltage property may be degraded. When the thickness exceeds 0.15 mm, heat conductivity is decreased such that heat dissipation efficiency may be decreased.

Here, the lower substrate 110 and the upper substrate 160 may be formed to have different sizes. For example, a volume, a thickness, or an area of one of the lower substrate 110 and the upper substrate 160 may be formed to be greater than a volume, a thickness, and an area of the other. Accordingly, endothermic reaction performance or exothermic reaction performance of the thermoelectric device may be increased.

Also, a heat dissipation pattern, for example, an uneven pattern, may be formed on a surface of at least one of the lower substrate 110 and the upper substrate 160. Accordingly, heat dissipation performance of the thermoelectric device may be increased. When the uneven pattern is formed on a side which comes into contact with the p-type thermoelectric leg 130 or the n-type thermoelectric leg 140, a bonding property between the thermoelectric leg and the substrate may be improved.

Meanwhile, the p-type thermoelectric leg 130 or the n-type thermoelectric leg 140 may have a cylindrical shape, a polyprism shape, an elliptic-cylindrical shape, and the like.

According to one embodiment of the present invention, in the p-type thermoelectric leg 130 or the n-type thermoelectric leg 140, a part bonded to the electrode may be formed to have a great width.

Here, the lower substrate 110 disposed on the duct 1100 may be aluminum substrates 1212 and 1312. The aluminum substrates 1212 and 1312 may adhere to the first surface 1112 and the second surface 1122, respectively, due to a TIM. Since the aluminum substrates 1212 and 1312 have excellent heat transfer performance, it is easy to transfer heat between one of both sides of the thermoelectric devices 1210 or 1310 and the duct 1100 through which the cooling fluid flows. Also, when the aluminum substrate 1212 or 1312 and the duct 1100, through which the cooling fluid flows, adhere to each other due to the TIM, the heat transfer between the aluminum substrate 1212 or 1312 and the duct 1100 through which the cooling fluid flows may not be interrupted.

Referring back to FIGS. 1 to 5, the cooling fluid may pass through the duct 1100 in a first direction, and a gas may pass between the plurality of heat conversion devices 1000-1, 1000-2, and 1000-3 in a direction perpendicular to the first direction and parallel to the first surface 1112 and the second surface 1122. To this end, one or a plurality of such gas guide members 1400 may be disposed for each duct 1100 and be disposed in a direction in which a high-temperature gas flows in. For example, when the duct 1100 is disposed such that the third side 1130 thereof faces the direction in which the high-temperature gas flows in and the fourth side 1140 faces a direction in which the high-temperature gas is discharged, the gas guide member 1400 may be disposed on the third side 1130 of the duct 1100. Otherwise, the gas guide member 1400 may be disposed on the fourth side 1140 of the duct 1100 according to an aerodynamic principle.

Here, a temperature of gas, which flows into spaces among the plurality of heat conversion devices 1000-1, 1000-2, and 1000-3 is higher than a temperature of gas discharged from the spaces among the plurality of heat conversion devices 1000-1, 1000-2, and 1000-3. For example, the gas, which flows into the spaces among the plurality of heat conversion devices 1000-1, 1000-2, and 1000-3, may be waste heat generated from engines of a vehicle, a vessel, and the like but is not limited thereto. For example, the temperature of the gas, which flows into the spaces among the plurality of heat conversion devices 1000-1, 1000-2, and 1000-3, may be greater than or equal to 100° C., preferably, 200° C., and more particularly, be from 220° C. to 250° C. but is not limited thereto. Here, a width of the spaces among the plurality of heat conversion devices 1000-1, 1000-2, and 1000-3 may be several millimeters and vary according to the size of the heat conversion device, the temperature of the inflow gas, an inflow speed of the gas, and a necessary power generation amount, and the like. Here, the spaces among the plurality of heat conversion devices 1000-1, 1000-2, and 1000-3 may each mean a distance between the heat dissipation fin 1320 of the second thermoelectric module 1300 of one heat conversion device 1000 and the heat dissipation fin 1220 of the first thermoelectric module 1200 of the heat conversion device 1000 adjacent thereto. For example, referring to FIG. 4, spaces a among the plurality of heat conversion devices 1000-1, 1000-2, and 1000-3 may be 10 mm or less, preferably, be 5 mm or less, and more particularly, be 3 mm or less. Although the heat dissipation fin 1320 of the second thermoelectric module 1300 of one heat conversion device 1000 and the heat dissipation fin 1220 of the first thermoelectric module 1200 of the heat conversion device 1000 adjacent thereto may come into contact with each other, a tolerance may occur in an assembling process. However, in comparison to a fluid pressure in a space in which the heat dissipation fins 1220 and 1320 are disposed, a fluid pressure in the spaces a among the plurality of heat conversion devices 1000-1, 1000-2, and 1000-3 may be lower such that the gas, which flows among the plurality of heat conversion devices 1000-1, 1000-2, and 1000-3, may be intended to pass through the spaces a among the plurality of heat conversion devices 1000-1, 1000-2, and 1000-3 in comparison to the heat dissipation fins 1220 and 1320 and eddy currents may occur in the spaces a among the plurality of heat conversion devices 1000-1, 1000-2, and 1000-3. Accordingly, when the spaces a among the plurality of heat conversion devices 1000-1, 1000-2, and 1000-3 each exceeds 10 mm, efficiency of heat exchange between the inflow gas and the heat dissipation fins 1220 and 1320 may be decreased. Also, as the spaces a among the plurality of heat conversion devices 1000-1, 1000-2, and 1000-3 increase, the number of heat conversion devices installable in a determined space may be reduced. Accordingly, the spaces a among the plurality of heat conversion devices 1000-1, 1000-2, and 1000-3 may be 10 mm or less, preferably, be 5 mm or less, and more particularly, be 3 mm or less.

The gas guide member 1400 may have a shape in which a distance from the third surface 1132 is farther from both ends of the third surface 1132 toward a center between the both ends of the third surface 1132 on the third surface 1132 included in the third side 1130 of the duct 1100 and facing the outside of the duct. For example, the gas guide member 1400 may have an umbrella shape or a roof shape. Accordingly, the high-temperature gas, for example, waste heat, may be guided to diverge through the gas guide member 1400 and pass through the spaces among the plurality of heat conversion devices 1000-1, 1000-2, and 1000-3. Here, a tilt angle θ of the gas guide member 1400 may be 10 to 80°, preferably, 20 to 70°, more particularly, 30 to 65°, and still more particularly, 45 to 60°. When the tilt angle θ of the gas guide member 1400 departs from such a numerical range, for example, when the tilt angle θ of the gas guide member 1400 exceeds an upper limit of the numerical range, the inflow gas may flow along the gas guide member 1400 and then move out of a region in which the heat dissipation fins 1220 and 1320 are disposed and flow through the spaces a among the plurality of conversion devices 1000-1, 1000-2, and 1000-3 such that efficiency of heat exchange may be decreased. Also, when the tilt angle θ of the gas guide member 1400 departs from the numerical range, for example when the tilt angle θ of the gas guide member 1400 is less than a lower limit of the numerical range, since it may be difficult to manufacture the gas guide member 1400 and a height of the heat conversion device is excessively high such that heat of the gas may be deprived by the gas guide member 1400, efficiency of heat exchange may be decreased.

Here, the gas guide member 1400 may be formed per a pair of thermoelectric modules 1200 and 1300 or may be formed per a plurality of such pairs of thermoelectric modules 1200 and 1300 consecutively disposed on one duct 1100.

Meanwhile, in one heat conversion device 1000, a width W1 between an outside of the first heat dissipation fin 1220 of the first thermoelectric module 1200 and an outside of the second heat dissipation fin 1320 of the second thermoelectric module 1300 may be greater than a width W2 of the gas guide member 1400. Also, a width W3 between the outside of the first thermoelectric device 1210 and the outside of the second thermoelectric device 1310 may be greater than or equal to the width of the gas guide member 1400. Here, each of the outside of the first heat dissipation fin 1220 and the outside of the second heat dissipation fin 1320 may mean a side opposite to a side facing the duct 1100. As described above, each of the outside of the first thermoelectric device 1210 and the outside of the second thermoelectric device 1310 may mean a side opposite to a side facing the duct

1100. Here, the first heat dissipation fin 1220 and the second heat dissipation fin 1320 may be formed in a direction which does not interrupt a gaseous flow. For example, the first heat dissipation fin 1220 and the second heat dissipation fin 1320 may have a plate shape extending along a second direction in which a gas flows. Otherwise, the first heat dissipation fin 1220 and the second heat dissipation fin 1320 may have a shape folded to form a flow path along the second direction in which the gas flows. Here, a maximum width W1 between the first heat dissipation fin 1220 of the first thermoelectric module 1200 and the second heat dissipation fin 1320 of the second thermoelectric module 1300 may mean a distance from a farthest point of the first heat dissipation fin 1220 to a farthest point of the second heat dissipation fin 1320 on the basis of the duct 1100. A maximum width W2 of the gas guide member 1400 may mean the width of the gas guide member 1400 in a region closest to the third surface 1132 of the duct 1100. Accordingly, the flow of the gas flowing in the second direction may not be interrupted by the gas guide member 1400 and be directly transferred to the first heat dissipation fin 1220 and the second heat dissipation fin 1320. Accordingly, since contact areas between the gas and the first heat dissipation fin 1220 and the second heat dissipation fin 1320 increase, heat quantities received from the gas to the first heat dissipation fin 1220 and the second heat dissipation fin 1320 increase such that power generation efficiency may be increased.

Here, a perpendicular distance d between the gas guide member 1400 and the heat dissipation fins 1220 and 1320 may be greater than or equal to 10 mm, preferably 15 mm, and more particularly, 17 mm. Accordingly, a space for fastening the gas guide member 1400, the duct 1100, the first thermoelectric module 1200, and the second thermoelectric module 1300 may be provided. The gas diverging due to the gas guide member 1400 may pass through the first heat dissipation fin 1220 and the second heat dissipation fin 1320 to be efficiently heat-exchanged. Particularly, as the perpendicular distance d between the gas guide member 1400 and the heat dissipation fins 1220 and 1320 increases, the gas diverging due to the gas guide member 1400 may efficiently pass through the first heat dissipation fin 1220 and the second heat dissipation fin 1320 without flow resistance. However, since the height of the heat conversion device becomes excessively high when the perpendicular distance d between the gas guide member 1400 and the heat dissipation fins 1220 and 1320 increases excessively, the number of the heat conversion devices arranged in a limited space may decrease and heat of the gas diverging due to the gas guide member 1400 may be cooled down before passing through the heat dissipation fins 1220 and 1320 such that efficiency of heat exchange may be decreased. Accordingly, the perpendicular distance d between the gas guide member 1400 and the heat dissipation fins 1220 and 1320 may be less than or equal to 200 mm, preferably 150 mm, and more particularly, 100 mm.

Meanwhile, in order to increase effects of sealing and insulating the first thermoelectric module 1200, the duct 1100, and the second thermoelectric module 1300, an insulation member 1700 and a shielding member 1800 may be further disposed between the third surface 1132 of the duct 1100 and the gas guide member 1400.

The insulation member 1700 may include a first insulation surface 1710 disposed on the third surface 1132, a second insulation surface 1720 extending from the first insulation surface 1710 in a direction parallel to the first surface 1112 and disposed on a part of the first surface 1112 or a part of the first thermoelectric device 1200, and a third insulation surface 1730 extending from the first insulation surface 1710 in a direction parallel to the second surface 1122 and disposed on a part of the second surface 1122 or a part of the second thermoelectric device 1300. Here, the part of the first thermoelectric device 1200 and the part of the second thermoelectric device 1300 may mean the lower substrates of the first thermoelectric device 1200 and the second thermoelectric devices 1300, and the lower substrates may be aluminum plates.

Also, the shielding member 1800 may include a first shielding surface 1810 disposed on the first insulation surface 1710, a second shielding surface 1820 extending from the first shielding surface 1810 in a direction parallel to the first surface 1112 and disposed on at least a part of the second insulation surface 1720, and a third shielding surface 1830 extending from the first shielding surface 1810 in a direction parallel to the second surface 1122 and disposed on at least a part of the third insulation surface 1730.

Particularly, the second shielding surface 1820 and the third shielding surface 1830 may be disposed on a boundary between the first thermoelectric device 1210 and the first heat dissipation fin 1220 and on a boundary between the second thermoelectric device 1310 and the second heat dissipation fin 1320, respectively.

According thereto, the high-temperature gas passing through the plurality of heat conversion devices 1000 only passes through the heat dissipation fins 1220 and 1320 of the first thermoelectric module 1200 and the second thermoelectric module 1300 and may be prevented from coming into direct contact with the thermoelectric devices 1210 and 1310 included in the first thermoelectric module 1200 and the second thermoelectric module 1300. Also, the gas guide member 1400 may be insulated from the side of the first thermoelectric module 1200 and the third side 1130 may be insulated from the side of the second thermoelectric module 1300 such that it is possible to prevent thermoelectric conversion performance from being degraded.

Meanwhile, the gas guide member 1400, the first shielding surface 1810, the first insulation surface 1710, and the third surface 1132 of the duct 1100 may be fastened together such that an air layer may be formed between the gas guide member 1400 and the second shielding surface 1810. Insulation performance between the gas guide member 1400 and the second shielding surface 1810 may be further increased due to the air layer.

Otherwise, in order to further increase insulation performance, an additional insulation member 1740 may be further disposed between the first insulation surface 1710 and the first shielding surface 1810.

Otherwise, although not shown in the drawings, one side of the gas guide member 1400 may extend to have a hollow triangle shape so as to be bonded to the first shielding surface 1810.

Meanwhile, according to an embodiment of the present invention, a height and a shape of the gas guide member 1400 may be variously modified.

Figure 8:
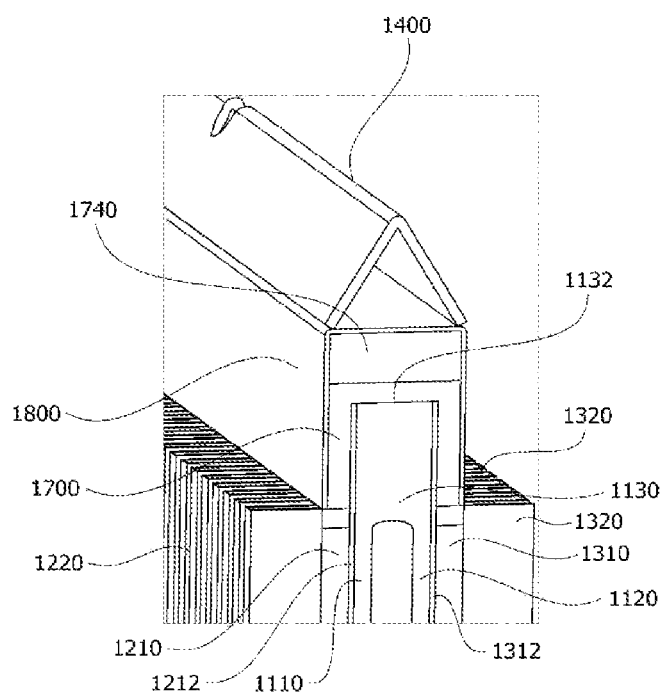
FIG. 8 is a partial perspective view of the heat conversion device according to one embodiment of the present invention.

FIG. 8 is a partial perspective view of the heat conversion device according to one embodiment of the present invention, and FIGS. 9A to 9D illustrate a variety of modified examples related to a height and shape of a gas guide member according to one embodiment of the present invention.

Figure 9A:
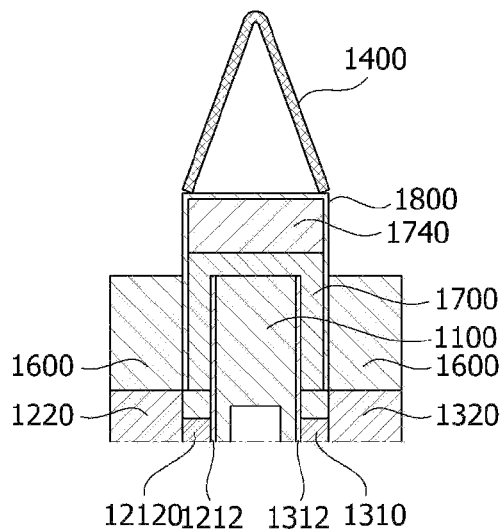
FIGS. 9A to 9D illustrate a variety of modified examples related to a height and shape of a gas guide member according to one embodiment of the present invention.
Figure 9B:
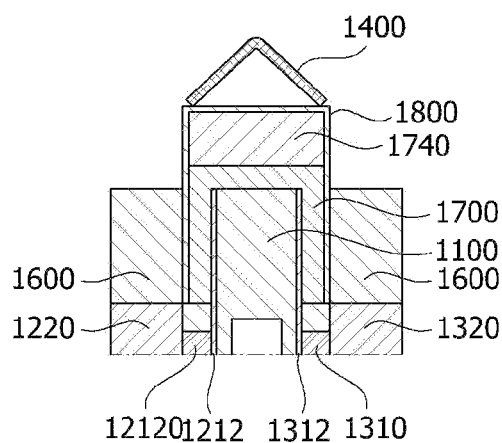

Referring to FIGS. 9A and 9B, the height of the gas guide member 1400 may vary according to a flow velocity of a gas. For example, as a flow velocity of the gas flowing through the spaces among the plurality of heat conversion devices 1000 becomes higher, as shown in FIG. 9A, a greater height of the gas guide member 1400 may be advantageous. As the flow velocity becomes lower, as shown in FIG. 9B, a smaller height of the gas guide member 1400 may be advantageous.

Figure 9C:
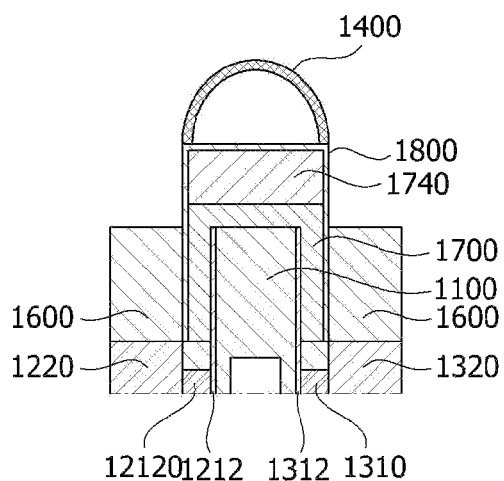
Figure 9D:
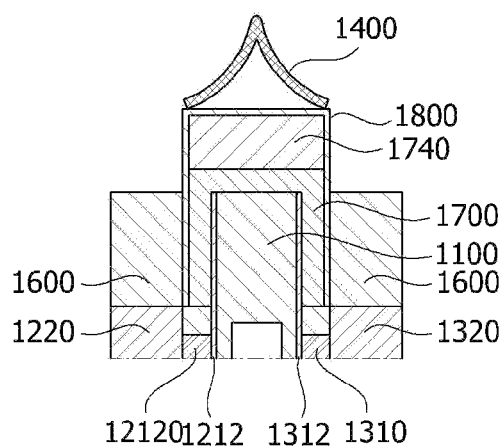

Otherwise, as shown in FIGS. 9C and 9D, the gas guide member 1400 may have a curved surface. For example, the gas guide member 1400 may have a dome shape in which a gradient increases from a center toward an edge as shown in FIG. 9C or have a shape in which a gradient is gentle from the center to the edge as shown in FIG. 9D.

As described above, the height and shape of the gas guide member 1400 may be adequately modified according to a flow rate and a flow velocity of the gas. As described above, when the gas guide member 1400 is fastened to the shielding member 1800, the insulation member 1700, and the duct 1100 using a screw and the like through a hole formed in the gas guide member 1400, it is possible to replace the gas guide member 1400 adequate for the flow rate and the flow velocity of the gas.

Meanwhile, although it has been described above that the flanges 1500 and 1600 are formed on the fluid inlet and the fluid outlet of the duct 1100 of the heat conversion device 1000, the present invention is not limited thereto.

Figure 10:
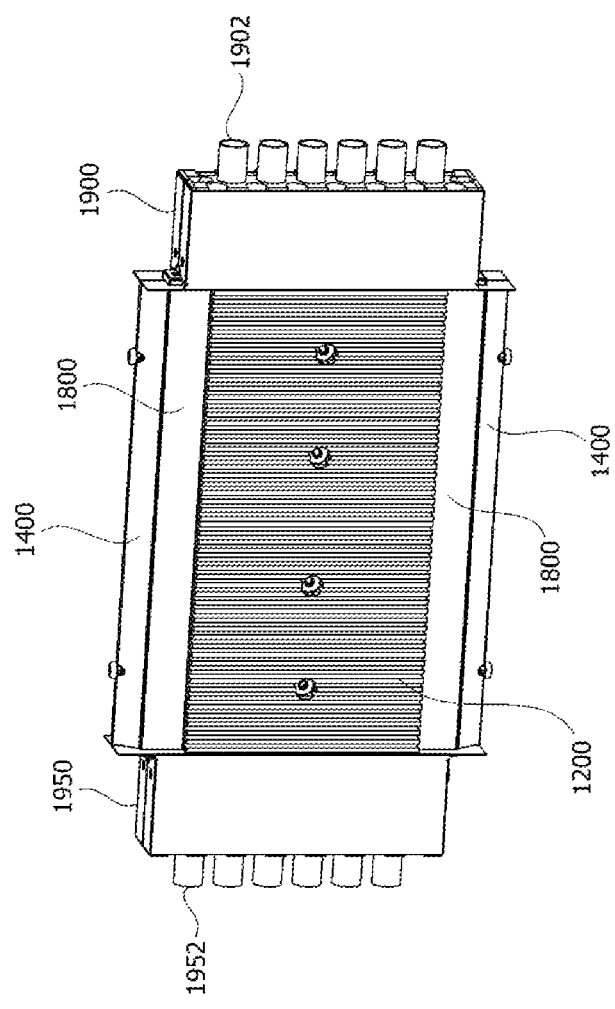
FIG. 10 is a perspective view of a heat conversion device according to another embodiment of the present invention.

FIG. 10 is a perspective view of a heat conversion device according to another embodiment of the present invention, and FIGS. 11 to 14 are perspective views of a heat conversion system including the heat conversion device of FIG. 10. A repetitive description of parts equal to those described above with reference to FIGS. 1 to 9D will be omitted.

Referring to FIG. 10, the heat conversion device 1000 may further include a fluid inlet portion 1900 disposed on one end of the duct 1100 to allow a cooling fluid to flow thereinto and a fluid outlet portion 1950 disposed on the other end of the duct 1100 to allow the cooling fluid to be discharged therethrough. As shown in the drawings, at least one fluid inlet pipe 1902 may be connected to the fluid inlet portion 1900, and at least one fluid outlet pipe 1952 may be connected to the fluid outlet portion 1950.

Figure 11:
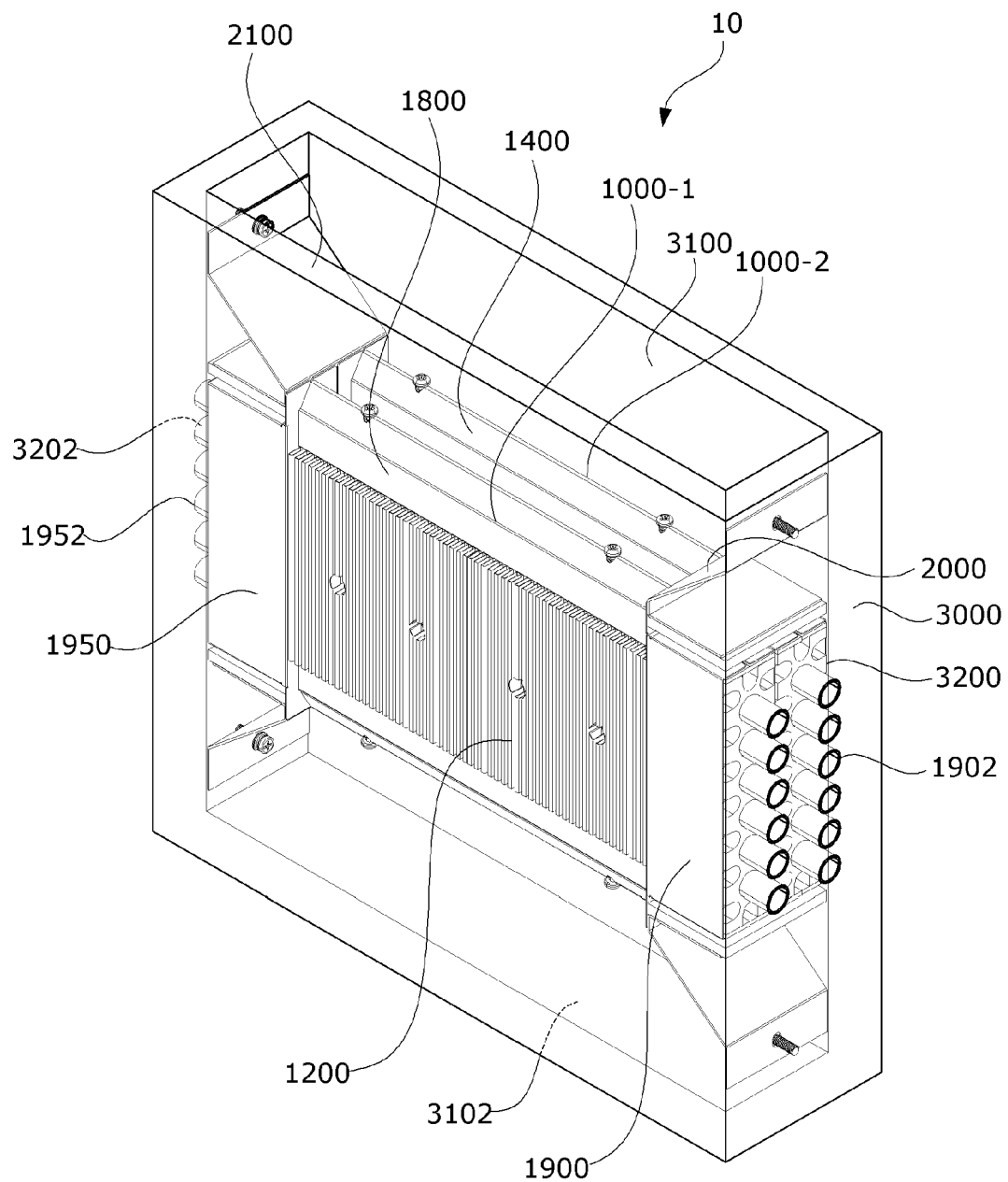
FIGS. 11 to 14 are perspective views of a heat conversion system including the heat conversion device of FIG. 10.
Figure 12:
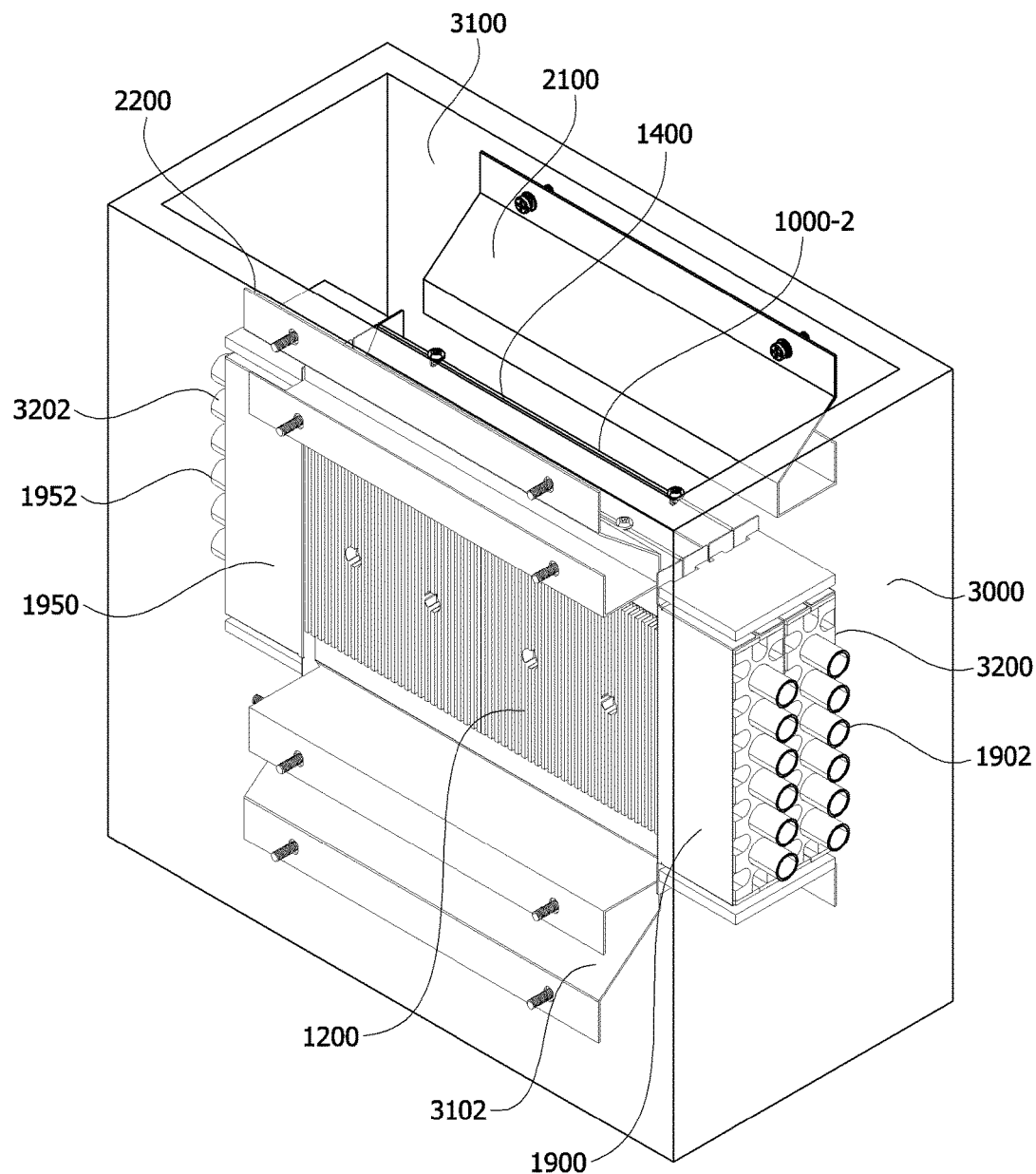
Figure 13:
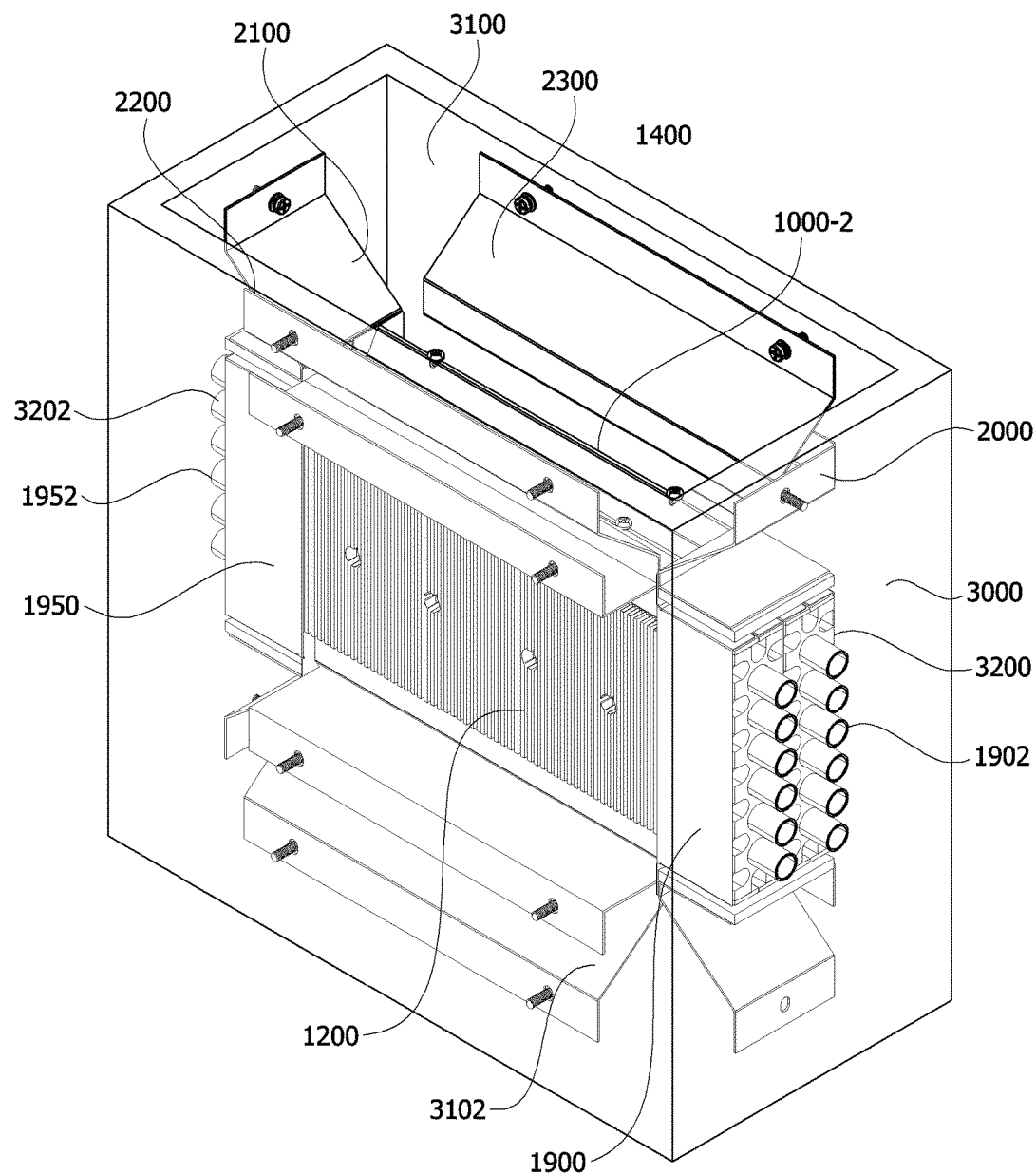

Meanwhile, referring to FIGS. 11 to 13, a first heat conversion device 1000-1 and a second heat conversion device 1000-2 may be supported by a frame 3000. Here, the frame 3000 includes openings 3100 and 3102 on both sides in the second direction to allow the gas to pass therethrough and includes openings 3200 and 3202 on both sides in a first direction to allow a cooling fluid to pass therethrough. Here, the fluid inlet pipe 1902 of the heat conversion device 1000 may pass through the opening 3200 and the fluid outlet pipe 1952 may pass through the opening 3202.

Meanwhile, referring to FIG. 11, a heat conversion system 10 according to the embodiment of the present invention may further include a first tilting member 2000 disposed to tilt from one wall surface of the frame 3000 toward one sides of the gas guide members 1400 of the first heat conversion device 1000-1 and the second heat conversion device 1000-2 and a second tilting member 2100 disposed to tilt from another wall surface of the frame 3000 toward other sides of the gas guide members 1400 of the first heat conversion device 1000-1 and the second heat conversion device 1000-2.

Here, the one wall surface of the frame 3000 may be a wall surface with the opening 3200 formed therein, and the other wall surface of the frame 3000 may be a wall surface with the opening 3202 formed therein. The one wall surface of the frame 3000, the first tilting member 2000, the gas guide members 1400, the second tilting member 2100, and the other wall surface of the frame 3000 may be sequentially arranged in the first direction.

A high-temperature gas, which flows into the heat conversion system 10, may be induced to move toward the region, in which the thermoelectric modules 1200 and 1300 are disposed, due to the first tilting member 2000 and the second tilting member 2100 such that power generation efficiency may be increased. Accordingly, the first tilting member 2000 and the second tilting member 2100 may be referred to as guide portions.

Particularly, in the embodiment in which the heat conversion device 1000 includes the fluid inlet portion 1900 and the fluid outlet portion 1950, when the first tilting member 2000 extends from the one wall surface of the frame 3000 toward a boundary between the duct 1100 and the fluid inlet portion 1900 and the second tilting member 2100 extends from the other wall surface of the frame 3000 toward a boundary between the duct 1100 and the fluid outlet portion 1950, since it is possible to prevent the high-temperature gas from flowing through the fluid inlet portion 1900 and the fluid outlet portion 1950, power generation efficiency may be maximized. That is, the first tilting member 2000, the gas guide member 1400, and the second tilting member 2100 may be arranged in the first direction not to be overlapped with each other. A tilting surface of the first tilting member 2000, a tilting surface of the gas guide member 1400, and a tilting surface of the second tilting member 2100 may be arranged in the second direction not to be overlapped with each other.

Here, the tilting surface of the gas guide member 1400 may form a tilt in a direction different from each of the tilting surfaces of the first tilting member 2000 and the second tilting member 2100. For example, with respect to a virtual surface formed in the first direction and a third direction perpendicular to a first direction in which a first fluid flows and a second direction in which a second fluid flows, that is, a direction in which the plurality of heat conversion devices are arranged, the tilting surfaces of the first tilting member 2000 and the second tilting member 2100 are disposed to form a tilt with a virtual line extending in the first direction, and the tilting surface of the gas guide member 1400 may be disposed to form a tilt with a virtual line extending in the third direction. Accordingly, the tilting surfaces of the first tilting member 2000 and the second tilting member 2100 tilt such that the second fluid flows in the second direction, and the tilting surface of the gas guide member 1400 may tilt such that the second fluid diverges and flows in the second direction.

Otherwise, referring to FIG. 12, the heat conversion system 10 according to the embodiment of the present invention may further include a third tilting member 2200 disposed to tilt from one wall surface of the frame 3000 toward one sides of the gas guide members 1400 of the first heat conversion device 1000-1 and a fourth tilting member 2300 disposed to tilt from another wall surface of the frame 3000 toward other sides of the gas guide members 1400 of the second heat conversion device 1000-2.

Here, the one wall surface of the frame 3000 may be a surface spaced at a certain interval apart from the first heat conversion device 1000-1 and disposed to be parallel to the thermoelectric module of the first heat conversion device 1000-1, and the other wall surface of the frame 3000 may be a surface which faces the one wall surface of the frame 3000, spaced at a certain interval apart from the second heat conversion device 1000-2, and disposed to be parallel to the thermoelectric module of the second heat conversion device 1000-2. That is, the one wall surface and the other wall surface of the frame 3000 may be wall surfaces disposed between wall surfaces on which the first tilting member 2000 and the second tilting member 2100 are disposed. Accordingly, the one wall surface of the frame 3000, the third tilting member 2200, the gas guide member 1400 of the first heat conversion device 1000-1, the gas guide member 1400 of the second heat conversion device 1000-2, the fourth tilting member 2300, and the other wall surface of the frame 3000 may be sequentially arranged in the direction perpendicular to the first direction and the second direction.

A high-temperature gas, which flows into the heat conversion system 10, may be induced to move toward the region, in which the thermoelectric modules 1200 and 1300 are disposed, due to the third tilting member 2200 and the fourth tilting member 2300 such that power generation efficiency may be increased. Accordingly, the third tilting member 2200 and the fourth tilting member 2300 may be referred to as guide portions.

Otherwise, referring to FIG. 13, the heat conversion system 10 according to the embodiment of the present invention may include the first tilting member 2000, the second tilting member 2100, the third tilting member 2200, and the fourth tilting member 2300 disposed on four wall surfaces of the frame 3000.

Although the first tilting member 2000, the second tilting member 2100, the third tilting member 2200, and the fourth tilting member 2300 are coupled to inner wall surfaces of the frame 3000 in FIGS. 11 to 13, the present invention is not limited thereto and at least one of the first tilting member 2000, the second tilting member 2100, the third tilting member 2200, and the fourth tilting member 2300 may be coupled through an outer wall surface of the frame 3000.

Figure 14:
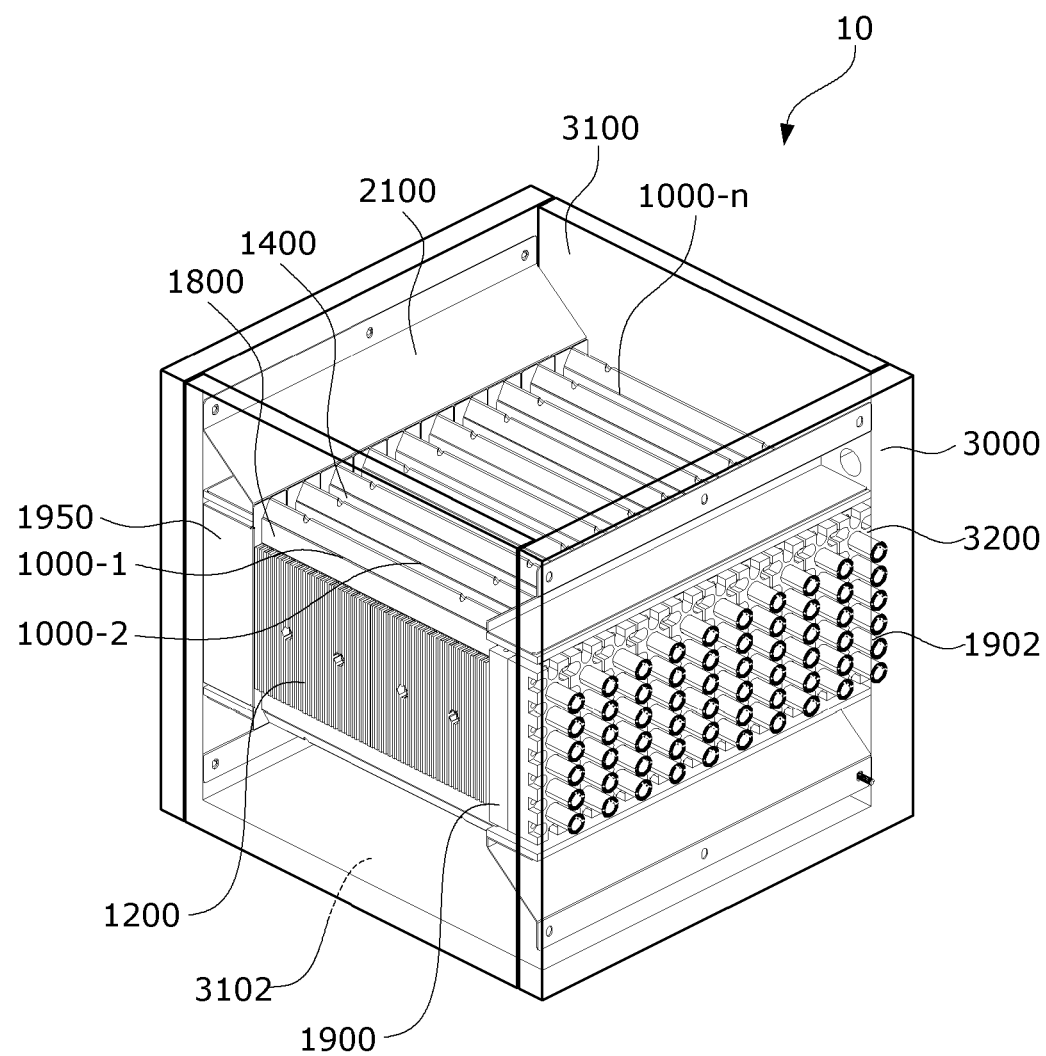

Although the heat conversion system including two heat conversion devices is shown in FIGS. 11 to 13, the present invention is not limited thereto and more than two heat conversion devices may be included as shown in FIG. 14. According thereto, the first tilting member 2000 and the second tilting member 2100 may extend lengthwise along a direction in which n number of the heat conversion devices are arranged, that is, along the third direction perpendicular to the first direction and the second direction.

Although the exemplary embodiments of the present invention have been described above, it may be understood by those skilled in the art that a variety of modifications and changes may be made without departing from the concept and scope of the present invention disclosed within the range of the following claims.

The invention claimed is:

1. A power generation device comprising:
a case comprising a through hole configured to pass therethrough in a first direction and form an inner surface;
a duct disposed in the through hole of the case and having a flow path such that a first fluid flows in a second direction perpendicular to the first direction;
a first thermoelectric module comprising a first thermoelectric device disposed on a first surface of the duct and a first fin disposed in the first thermoelectric device;
a second thermoelectric module comprising a second thermoelectric device disposed on a second surface facing the first surface of the duct and a second fin disposed in the second thermoelectric device;
a plurality of first guide portions coupled to the case and disposed on the duct while facing each other; and
a second guide portion disposed on a third surface formed between the first surface and the second surface of the duct, wherein the second guide portion extends between the plurality of first guide portions in the second direction,
wherein the plurality of first guide portions and the second guide portion each comprise a tilting surface, and
wherein a tilt angle of the tilting surface of the second guide portion differs from a tilt angle of the tilting surface of each of the plurality of first guide portions.

2. The power generation device of claim 1, wherein the tilting surface of the second guide portion is disposed in the second direction.

3. The power generation device of claim 2, wherein the tilting surface of the first guide portion tilts such that a second fluid flows in the first direction.

4. The power generation device of claim 3, wherein a temperature of the second fluid is higher than a temperature of the first fluid.

5. The power generation device of claim 1, wherein the duct comprises a plurality of support portions coupled to the inner surface of the through hole of the case and disposed to face each other and a body portion disposed between the plurality of support portions,
wherein the plurality of first guide portions are disposed on the plurality of support portions of the duct, and
wherein the second guide portion is disposed on the body portion of the duct.

6. The power generation device of claim 5, wherein the first guide portions and the second guide portion are not overlapped with each other in the first direction.

7. The power generation device of claim 5,
wherein a length of each of the plurality of support portions of the duct in the second direction is smaller than a length of the body portion of the duct in the first direction.

8. The power generation device of claim 7, wherein each of the plurality of first guide portions comprises a coupling portion coupled to the inner surface of the through hole and becomes more adjacent to the duct in a direction away from the coupling portion in the second direction.

9. The power generation device of claim 8, wherein the second guide portion and the tilting surfaces of the plurality of first guide portions are not overlapped with each other in the second direction.

10. The power generation device of claim 9, wherein the plurality of first guide portions each comprise a first end most adjacent to the duct, and
wherein the second guide portion comprises an end in the second direction.

11. The power generation device of claim 10,
wherein a plurality of first ends of the plurality of first guide portions are disposed on the support portions of the ducts.

12. The power generation device of claim 1, wherein the first fin and the second fin each extend in the first direction.

13. The power generation device of claim 12, wherein the first fin and the second fin are each spaced at a certain interval apart from the second guide portion in the first direction.

14. The power generation device of claim 13, wherein the duct comprises a plurality of such spaced-apart ducts,
wherein each of the plurality of ducts comprises a first surface and a second surface, which face each other, and
wherein the first thermoelectric module comprises a plurality of one-side thermoelectric modules disposed on the first surface and the second thermoelectric module comprises a plurality of other-side thermoelectric modules disposed on the second surface.

15. The power generation device of claim 14, wherein the plurality of one-side thermoelectric modules comprise a plurality of first portions facing the inner surface of the through hole and a plurality of second portions facing the second thermoelectric module, and wherein the plurality of other-side thermoelectric modules comprise a plurality of third portions facing the inner surface of the through hole and a plurality of fourth portions facing the first thermoelectric module.

16. The power generation device of claim 15, wherein the second portions of the one-side thermoelectric modules are spaced at certain intervals apart from the fourth portions of the other-side thermoelectric modules.

17. The power generation device of claim 12, wherein each of the first thermoelectric module and the second thermoelectric module comprises a plurality of first fastening portions coupled to the duct.

18. The power generation device of claim 17, wherein the plurality of first fastening portions are disposed to be spaced apart from each other in the second direction.

19. The power generation device of claim 1, wherein the second guide portion comprises a plurality of grooves, and wherein the plurality of grooves are disposed to be spaced apart from each other in the second direction.

20. The power generation device of claim 19, wherein a plurality of second fastening portions are disposed in the plurality of grooves of the second guide portion, wherein a plurality of first fastening portions face the first surface and the second surface of the duct, wherein the plurality of second fastening portions face the third surface of the duct, and wherein the first surface and the second surface are perpendicular to the third surface.

* * * * *